United States Patent [19]
Ramesh et al.

[11] Patent Number: 5,668,820
[45] Date of Patent: Sep. 16, 1997

[54] DIGITAL COMMUNICATION SYSTEM HAVING A PUNCTURED CONVOLUTIONAL CODING SYSTEM AND METHOD

[75] Inventors: Rajaram Ramesh; Barbara Davis Molnar, both of Cary, N.C.

[73] Assignee: Ericsson Inc., Research Triangle Park, N.C.

[21] Appl. No.: 377,073

[22] Filed: Jan. 23, 1995

[51] Int. Cl.$^6$ .................................................. H03M 13/12
[52] U.S. Cl. .......................................................... 371/43.1
[58] Field of Search ............................................. 371/43, 41

[56] References Cited

U.S. PATENT DOCUMENTS

| | | | |
|---|---|---|---|
| 4,462,101 | 7/1984 | Yasuda et al. | 371/43 |
| 4,908,827 | 3/1990 | Gates | 371/43 |
| 4,939,734 | 7/1990 | Heichler | 371/43 |
| 5,029,331 | 7/1991 | Heichler et al. | 371/43 |
| 5,416,787 | 5/1995 | Kodama et al. | 371/43 |
| 5,438,590 | 8/1995 | Tzukerman et al. | 375/259 |

FOREIGN PATENT DOCUMENTS

| | | | |
|---|---|---|---|
| 0624019 | 11/1994 | European Pat. Off. | H04L 27/34 |

OTHER PUBLICATIONS

J.B. Cain, G.C. Clark Jr., and J.M. Geist, "Punctured Convolutional Codes of Rate (n−1)/n and Simplified Maximum Likelihood Decoding," IEEE Trans. Info. Theory, vol. IT–25, pp. 97–100, Jan. 1979.

Y. Yasuda, Kanshiro Kashiki, and Yasuo Hirata, "High-Rate Punctured Convolutional Codes for Soft Decision Viterbi Decoding," IEEE Trans. Commun., vol. COM–32, pp. 315–319, Mar. 1984.

Hagenauer, J., "Rate–Compatible Punctured Convolutional Codes (RCPC Codes) and their Applications", IEEE Transactions on Communications, vol. 36, No. 4, pp. 389–400, Apr. 1988.

Primary Examiner—Stephen M. Baker
Attorney, Agent, or Firm—Scot R. Hewitt

[57] ABSTRACT

A digital communication system having a punctured convolutional coding system and method. The digital communication system includes a coder for coding a digital input to be transmitted from a transmitter and a decoder for decoding the coded input received at the receiver. The coder includes a convolutional coding circuit of rate k/n for outputting a convolutional coded output and a puncturing circuit for puncturing the convolutionally coded output to achieve a punctured code rate of z/q, where $z=\gamma k$. The puncturing circuit punctures the convolutional coded output according to a deleting pattern chosen to have a bit length of $L=p\gamma n$, where $p \geq 2$. The puncturing circuit outputs a punctured output at punctured code rate of z/q and the punctured output is transmitted to the receiver. The receiver decodes the transmitted punctured output and outputs a decoded output.

18 Claims, 6 Drawing Sheets

DIGITAL COMMUNICATION SYSTEM HAVING A PUNCTURED CONVOLUTIONAL CODING SYSTEM AND METHOD

FIELD OF INVENTION

The present invention relates generally to a digital communication system, and more particularly, a digital communication system having a punctured convolutional coding system and method.

BACKGROUND OF THE INVENTION

In a digital communication system, noise in a transmission channel tends to corrupt bit streams of data being transmitted from a transmitter to a receiver. The impact of noise on a transmitted bit stream can be minimized by coding the bit stream with FEC techniques. One FEC technique currently used in digital communication systems is punctured convolutional coding.

Punctured convolutional coding techniques in digital communication systems are known in the prior art as shown by the teachings of the following prior art references which are incorporated herein by reference: U.S. Pat. No. 5,029,331, issued on Jul. 2, 1991, to Heichler et al.; U.S. Pat. No. 4,908,827, issued on Mar. 13, 1990, to Gates; U.S. Pat. No. 4,462,101, issued on Jul. 24, 1984, to Yasuda et al.; *Punctured Convolutional Codes of Rate (n−1)/n and Simplified Maximum Likelihood Decoding*, by J. Bibb Cain, George C. Clark, Jr., and John M. Geist, in *IEEE Transactions on Information Theory*, Vol. IT-25, No. 1, January 1979, pp. 97–100; and *High Rate Punctured Convolutional Code for Soft Decision Viterbi Decoding*, by Yutaka Yasuda, Kanshiro Kashiki, and Yasuo Hirata, in *IEEE Transactions on Communications*, Vol. COM-32, No. 3, March 1984, pp. 315–319.

In general, communication systems using punctured convolutional coding include a coder for coding a digital input to be transmitted from a transmitter and a decoder for decoding the coded input received at the receiver. The coder includes a convolutional coding circuit which receives the digital input and outputs a convolutional coded output. The digital input is coded by the convolutional coding circuit so that for every k-bits inputted into the convolutional coding circuit, a corresponding n-bits, where n>k, is outputted. The k-bits inputted and the corresponding n-bits outputted are referred to as k-tuples and n-tuples, respectively. A convolutional coding rate for the convolutional coding circuit is defined as the ratio of the number of k-bits inputted to the number of n-bits outputted, and can be expressed as k/n. For example, the coding rate is 1/2 when for each bit inputted into the convolutional coding circuit there is a corresponding two bits outputted.

In order to increase the code rate of the coder, the convolutional coded output is passed through a puncturing circuit which includes a transmission mask circuit and deleting pattern memory for transmitting only selected bits of the convolutionally coded output. The puncturing circuit outputs a punctured output having a punctured code rate of z/q, where z=γk. A punctured code rate of z/q means that for every z input bits inputted into the convolutional coding circuit q bits are outputted from the puncturing circuit.

The desired punctured code rate is achieved by passing a convolutional coded output through the transmission mask circuit and puncturing the convolutional coded output on a block-by-block basis. Each block to be punctured is formed from a plurality of n-tuples and is referred to as a puncturing block. The number of n-tuples used to form each puncturing block is currently determined by recognizing that to provide a punctured code rate of z/q, where z=γk, for a convolutional coded output of rate k/n, at least γ convolutionally coded n-tuples must be grouped and punctured as a puncturing block to achieve the desired punctured code rate. Accordingly, the bit length of each puncturing block is equal to γ convolutionally coded n-tuples multiplied by the number of bits in each n-tuple. The bit length of the puncturing block can be expressed as L=γn.

The puncturing blocks are punctured according to a deleting pattern which has a length equal to that of a puncturing block. The bits of the deleting pattern have a one-to-one correspondence with the bits in each of the puncturing blocks. Accordingly, the deleting pattern is chosen to have a length that can be expressed as L=γn. The deleting pattern chosen has the minimum bit length necessary to achieve the desired punctured code rate of z/q for a convolutional coding rate of k/n.

The deleting pattern used by the puncturing circuit is an L-length block of ones and zeros, with each one representing a transmission bit and each zero representing a non-transmission bit. (The transmission bits and non-transmission bits are also referred to as non-deleting bits and deleting bits, respectively.) The ratio of ones to zeros in the L-length deleting pattern is chosen to achieve the desired punctured code rate. It is the ratio of ones to zeros in the deleting pattern that determines the punctured code rate.

For example, a ⅔ punctured rate is achieved for a rate ½ convolutional coding circuit by using a deleting pattern of length four (i.e., L=zn=2×2=4). The length four deleting pattern is chosen to have three transmission bits and one non-transmission bit so that the new punctured rate of ⅔ is achieved.

There are a plurality of different deleting patterns having the same ratio of ones to zeros and having the same bit length but having unique arrangements or patterns of ones and zeros. The arrangement or pattern of ones and zeros in a deleting pattern affects the distance properties of the punctured code. To minimize the bit error rate of the communication system, a deleting pattern having the desired bit length and ratio of ones to zeros is typically chosen in an attempt to optimize the distance properties of the punctured code.

To select an optimal deleting pattern once the length and ratio of ones to zeros is determined, a puncturing table of potential deleting patterns in which distance properties have been calculated for each deleting pattern can be consulted. Selecting an optimal deleting pattern for a given deleting pattern length and ratio of ones to zeros is well-known as indicated by the following incorporated references: *Punctured Convolutional Codes of Rate (n−1)/n and Simplified Maximum Likelihood Decoding*, by J. Bibb Cain, George C. Clark, Jr., and John M. Geist, in *IEEE Transactions on Information Theory*, Vol. IT-25, No. 1, January 1979, pp. 97–100; and *High Rate Punctured Convolutional Code for Soft Decision Viterbi Decoding*, by Yutaka Yasuda, Kanshiro Kashiki, and Yasuo Hirata, in *IEEE Transactions on Communications*, Vol. COM-32, No. 3, March 1984, pp. 315–319. The optimal deleting pattern selected from a puncturing table is used by the puncturing circuit in puncturing on a block-by-block basis the convolutional coded output.

A digital communication system having a punctured convolutional coding system and method that improves the distance properties of the punctured code and the associated bit error rate is needed. More particularly, the punctured convolutional coding system and method of such a digital communication system should utilize a more effective deleting pattern so as to achieve better distance properties for the punctured code and an improved bit error rate for the digital communication system.

SUMMARY OF THE INVENTION

The present invention is a digital communication system having a punctured convolutional coding system and method. The punctured convolutional coding system and method of the digital communication system achieves better distance properties for the punctured code resulting in an improved bit error rate. The distance properties of the punctured code and the associated bit error rate is improved by convolutionally coding a digital input to produce a convolutional coded output and puncturing the convolutional coded output according to a deleting pattern having an extended bit length. As discussed below, puncturing a convolutional coded output with a deleting pattern having an extended bit length compared to the deleting patterns used in prior art digital communication systems provides for a punctured code having better distance properties. Accordingly, for a digital communication system having a particular convolutional code rate and punctured code rate, the digital communication system of the present invention employs an extended deleting pattern providing for better distance properties for the punctured code.

The improved convolutional coding system and method is implemented in a digital communication system having a transmitter and a remote receiver. The transmitter of the digital communication system includes a coder having a convolutional coding circuit for outputting a convolutional coded output of code rate k/n and a puncturing circuit for outputting a punctured output having a punctured code rate of z/q, where z=γk. The puncturing circuit receives the convolutional coded output and bits of the convolutional coded output are grouped into puncturing blocks. The puncturing blocks are punctured according to the deleting pattern on a block-by-block basis.

For a digital communication system having a convolutional code rate of k/n and a punctured code rate of z/q, where z=γk, each puncturing block and the deleting pattern have a bit length of L=pγn, where p is ≧2. As discussed previously, digital communication systems of the prior art use a deleting pattern having a truncated minimum deleting pattern bit length of L=γn. Accordingly, the deleting pattern bit length of the present invention is a multiple of at least two of the minimum deleting pattern bit lengths of the deleting patterns used in prior art digital communication systems.

Puncturing the convolutional coded output according to a deleting pattern having a larger number of bits allows a more optimal deleting pattern to be chosen for the depuncturing circuit. Thus, the depuncturing circuit generates a punctured code having better distance properties and the bit error rate of the communication system is improved.

DETAILED DESCRIPTION OF THE PREFERRED EMBODIMENTS

Figure 1:
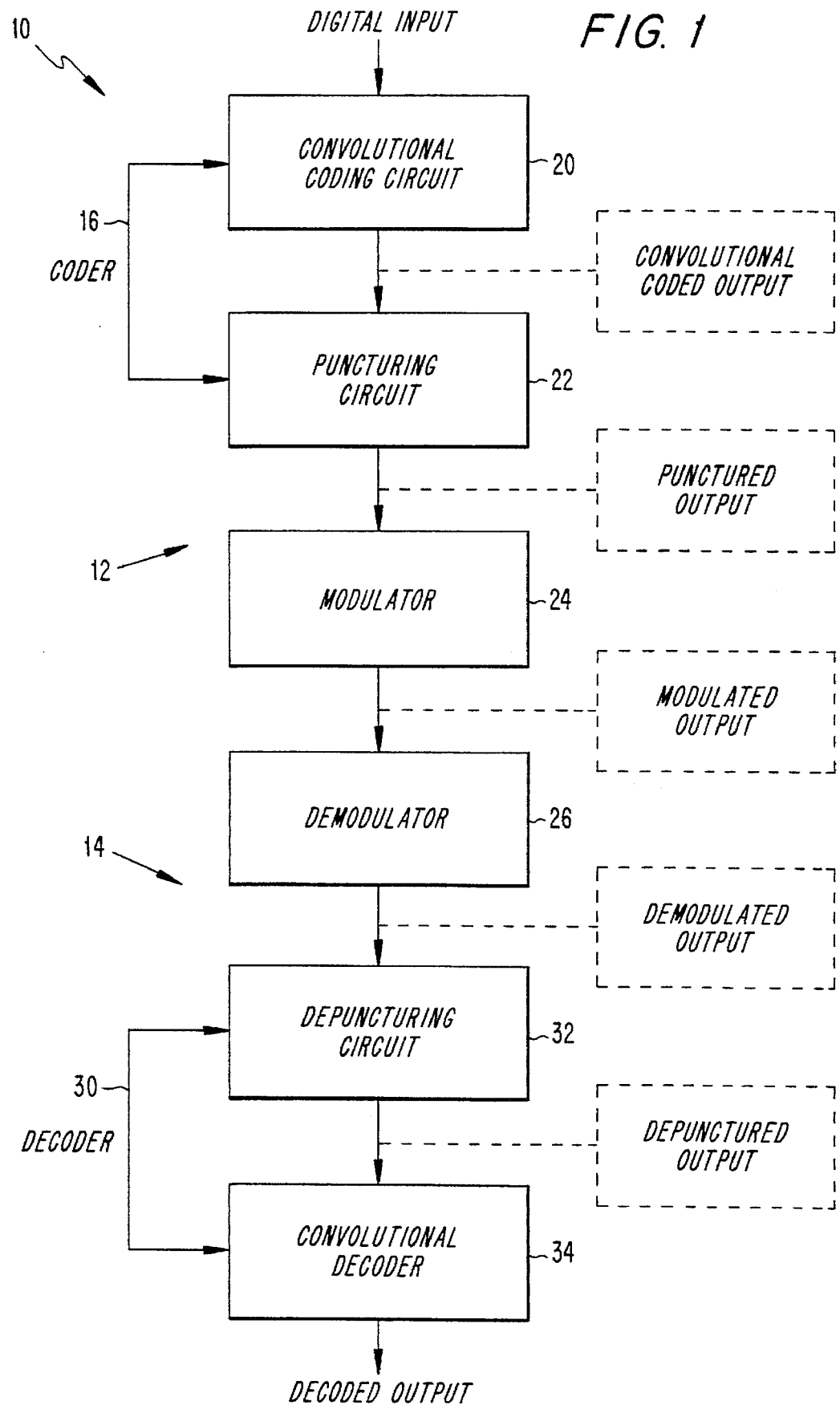
FIG. 1 is a block diagram of the digital communication system of the present invention.

Referring to the drawings, the digital communication system having the punctured convolutional coding method and system of the present invention is indicated generally by the numeral 10. As shown in FIG. 1, the digital communication system 10 generally includes a transmitter 12 for coding and transmitting a digital input, and a receiver 14 for receiving and decoding the transmitted, coded input. The transmitter 12 includes the general components of a coder 16 having a convolutional coding circuit 20 and a puncturing circuit 22 for coding the digital input, and a modulator 24 for transmitting the coded input. As schematically shown in FIG. 1, the convolutional coding circuit 20 codes the digital input to generate a convolutional coded output and the puncturing circuit 22 punctures the convolutional coded output to generate a punctured output. After the input has been coded by coder 16, modulator 24 modulates the punctured output and transmits the modulated output to receiver 14.

Receiver 14 generally includes a demodulator 26, and a decoder 30 having a depuncturing circuit 32 and a convolutional decoder 34. The demodulator 26 demodulates the modulated output received from the transmitter 12 and outputs to decoder 30 a demodulated output. The depuncturing circuit 32 outputs a depunctured output and convolutional decoder 34 decodes the depunctured output and outputs a decoded output corresponding to the digital input.

Figure 2:
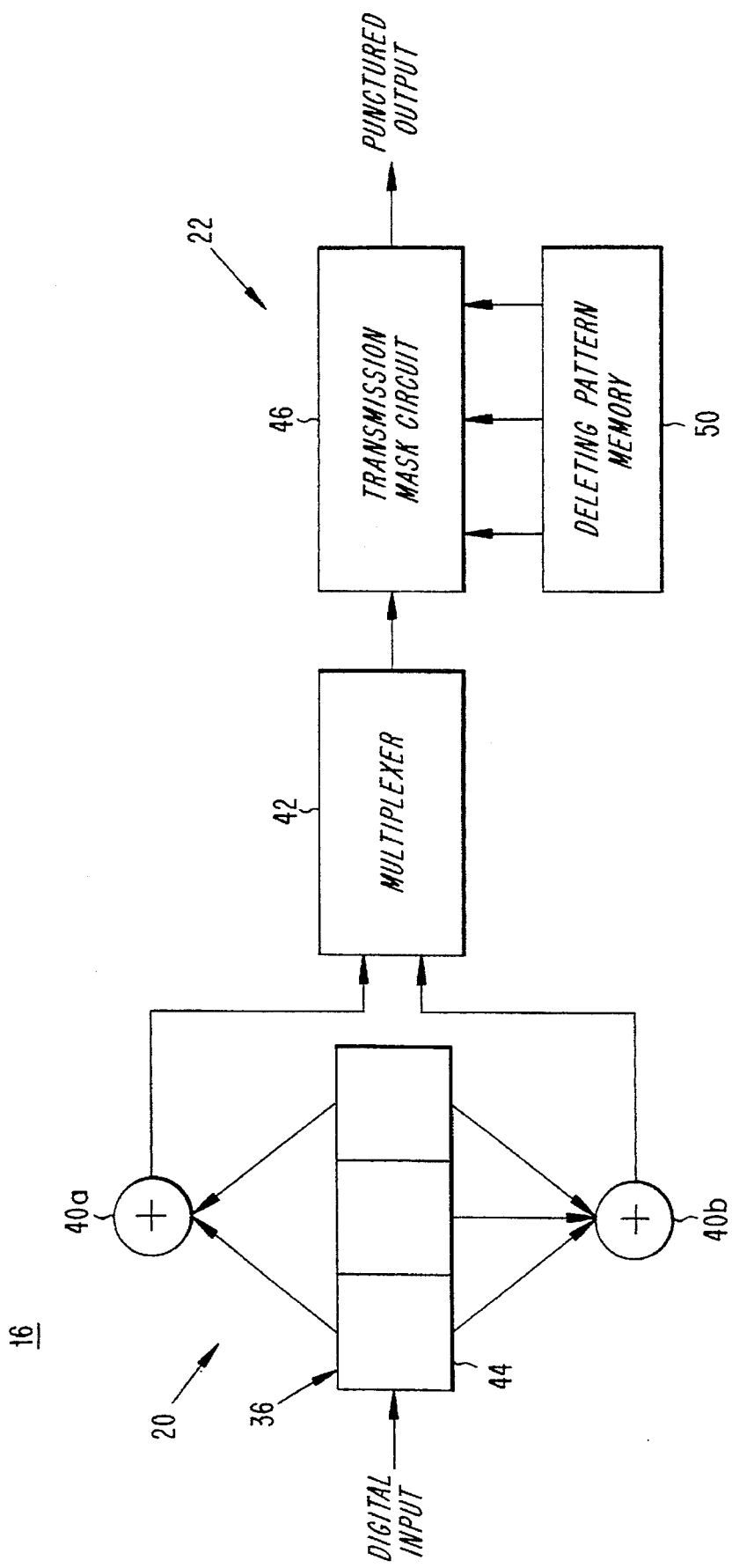
FIG. 2 is a block diagram of the coder of the preferred embodiment.

Referring to FIG. 2, the preferred embodiment of coder 16 is shown in more detail. FIG. 2 depicts a simplified convolutional coding circuit 20 that will be used to describe the present invention. Convolutional coding circuit 20 includes a shift register 36, function generators 40a and 40b, and a multiplexer 42. Shift register 36 serially receives input bits from the digital input which is in the form of an input bit stream. The bits are shifted along k-bits at a time into successive k-bit stages 44 of the shift register 36 with a group of k-bits being referred to as a k-tuple. The convolutional coding circuit 20 of FIG. 1 depicts a shift register 36 where k=1 and one bit at a time is shifted into successive k-bit stages 44 of the shift register 36. As is well known, convolutional coding circuit 16 having additional function generators and multi-bit stages could be provided.

The function generators 40a and 40b in the preferred embodiment are modulo-2 adders and are connected to different stages 44 of register 36. Output bits are generated by each generator 40 to form generator bit streams and the generator bit streams are combined together by multiplexer 42 to form a convolutionally coded output. The convolutionally coded output consists of a bit stream of successive n-tuples where each n-tuple is formed by n-bits, where n>k, and corresponds to a k-tuple inputted into the convolutional coding circuit. The ratio of k-bits entering the convolutional coding circuit 20 to n-bits exiting is referred to as the convolutional coding rate, and is expressed as k/n.

The puncturing circuit 22 is coupled to the convolutional coding circuit 20 and receives the convolutional coded output. The puncturing circuit 22 includes a transmission mask circuit 46 through which the convolutional coded output passes and a deleting pattern memory 50 connected to the transmission mask circuit 46. The transmission mask circuit 46 functions to puncture the convolutional coded bit stream as it passes therethrough to produce a punctured output. In other words, the transmission mask circuit 46 transmits selected bits in the convolutionally coded output and fails to transmit other selected bits. Because fewer bits are outputted from the puncturing circuit 22 than inputted, the punctured code rate for coder 16 is larger than the convolutional code rate. Puncturing circuit 22 outputs a punctured output having a punctured code rate of $z/q$, where $z=\gamma k$. A punctured code rate of $z/q$ means that for every $z$ input bits inputted into the convolutional coding circuit 20, $q$ bits must be outputted from the puncturing circuit 22.

As the convolutionally coded output passes through the transmission mask circuit 46, bits of the convolutional coded output are grouped together to form puncturing blocks. Each puncturing block includes L-bits from the convolutionally coded output. As discussed in more detail below, the number of bits selected to form a puncturing block is a function of the convolutional code rate and the punctured code rate.

Blocks of convolutionally coded output are punctured according to a deleting pattern stored in the deleting pattern memory 50. The deleting pattern is an L-length series of ones and zeros, with each one representing a transmission bit and each zero representing a non-transmission bit. The deleting pattern bits have a one-to-one correspondence with the bits in each puncturing block, and the ratio of ones to zeros in the deleting pattern is chosen to achieve the desired punctured code rate.

In prior art digital communication systems, the puncturing block and corresponding deleting pattern length was chosen to have the minimum bit length necessary to achieve the desired punctured code rate. More particularly, each puncturing block was formed from a plurality of convolutionally coded n-tuples. The number of n-tuples used to form each puncturing block was determined by recognizing that to provide a punctured code rate of $z/q$, where $z=\gamma k$, for a convolutional coded output of rate $k/n$, at least $z$ convolutionally coded n-tuples must be grouped and punctured as a block to achieve the desired punctured code rate. Accordingly, the bit length of each puncturing block for prior art digital communication systems was equal to $\gamma$ convolutionally coded n-tuples multiplied by the number of bits in each n-tuple. The bit length of the puncturing blocks of the prior art can be expressed as $L=\gamma n$.

The present invention digital communication system provides for an improved convolutional coding method and system by increasing the bit-length of the puncturing block and the deleting pattern above the minimum bit length required to puncture a convolutional coded output to achieve a desired punctured code rate. As discussed, the minimum bit length of a puncturing block to achieve a punctured code rate of $z/q$, where $z=\gamma k$, for a convolutional coding circuit of code rate $k/n$ is $L=\gamma n$. The bit length of the mask block and deleting pattern for the present invention is selected to be a multiple of the minimum block bit length and is expressed as $L=p\gamma n$, where $p$ is an integer $\geq 2$.

The selection of an increased bit length for the mask block and deleting pattern is advantageous because the number of potential deleting patterns that can be chosen to be used by the puncturing circuit increases as the deleting pattern length increases and a deleting pattern having improved distance properties is available for selection. Thus, increasing the puncturing block length allows a better deleting pattern to be selected for puncturing circuit 22. Use of a better deleting pattern results in improved distance properties of the punctured output and minimized bit errors during transmission.

Figure 3:
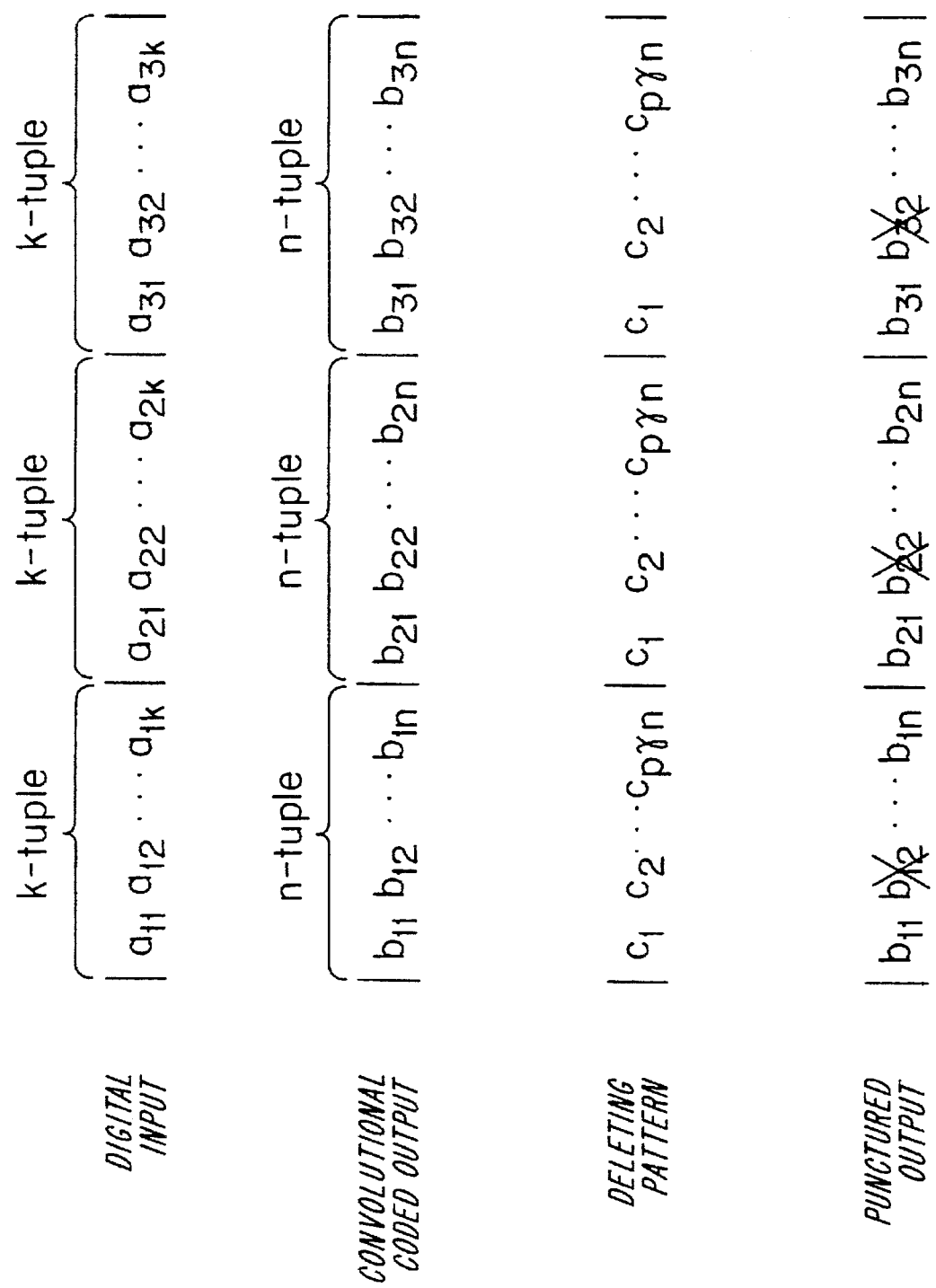
FIG. 3 is a schematic representation of a generic bit stream passing through the coder.

Referring to FIG. 3, a schematic representation of the flow of a generic input bit stream through coder 16 having a convolutional code rate of $k/n$ and a punctured code rate of $z/q$, where $z=\gamma k$, is shown. Initially, an input bit stream, depicted by $a_{11}$-$a_{1k}$, $a_{21}$-$a_{2k}$, etc., is inputted into convolutional coding circuit 20. The input bit stream can be viewed as being formed by a series of k-tuples, with each k-tuple containing k-bits. For each k-tuple inputted into the convolutional coding circuit 20, a corresponding n-tuple of n-bits, where $n>k$, is outputted from the convolutional coding circuit 20 to generate a convolutional coded output depicted by $b_{11}$-$b_{1n}$, $b_{21}$-$b_{2n}$, etc.

The convolutionally coded output is then inputted into the puncturing circuit 22. The convolutional coded output is punctured on a block-by-block basis by the puncturing circuit 22 according to a deleting pattern, $c_1$-$c_{p\gamma n}$. Each block of the convolutionally coded output and the deleting pattern have a bit length of $p\gamma n$, where $p$ is an integer $\geq 2$. Accordingly, a multiple of n-tuples is selected to form each puncturing block so that the number of bits in each puncturing block is greater than the minimum number of puncturing block bits required to achieve the desired punctured code rate. A punctured output is then outputted from the puncturing circuit 22 and one punctured block is depicted as $|b_{11}\ b_{12}\ \ldots\ b_{1n}b_{21}\ b_{22}\ \ldots\ b_{(p\gamma)n}|$, where the bits of the convolutionally coded output that were not transmitted are shown crossed out in FIG. 3. The punctured block shown in FIG. 3 has a block bit length equal to the bit length of the deleting pattern, and the block bit length can be expressed as $L=p\gamma n$.

Figure 4A:
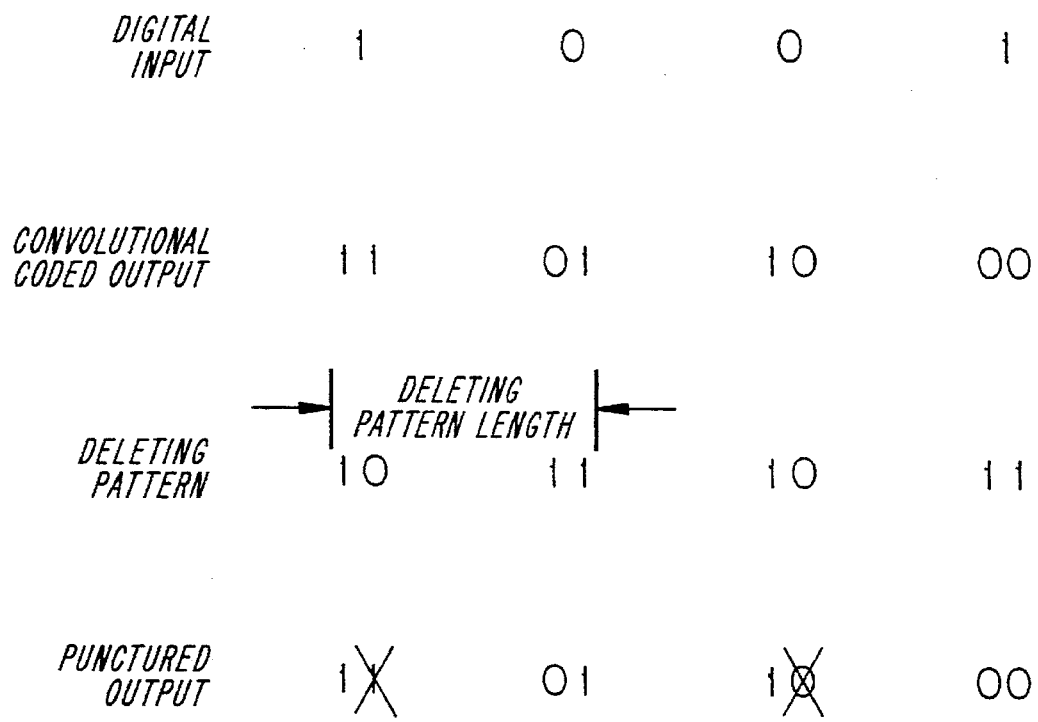
FIG. 4a shows an example bit stream passing through a prior art coder.
Figure 4B:
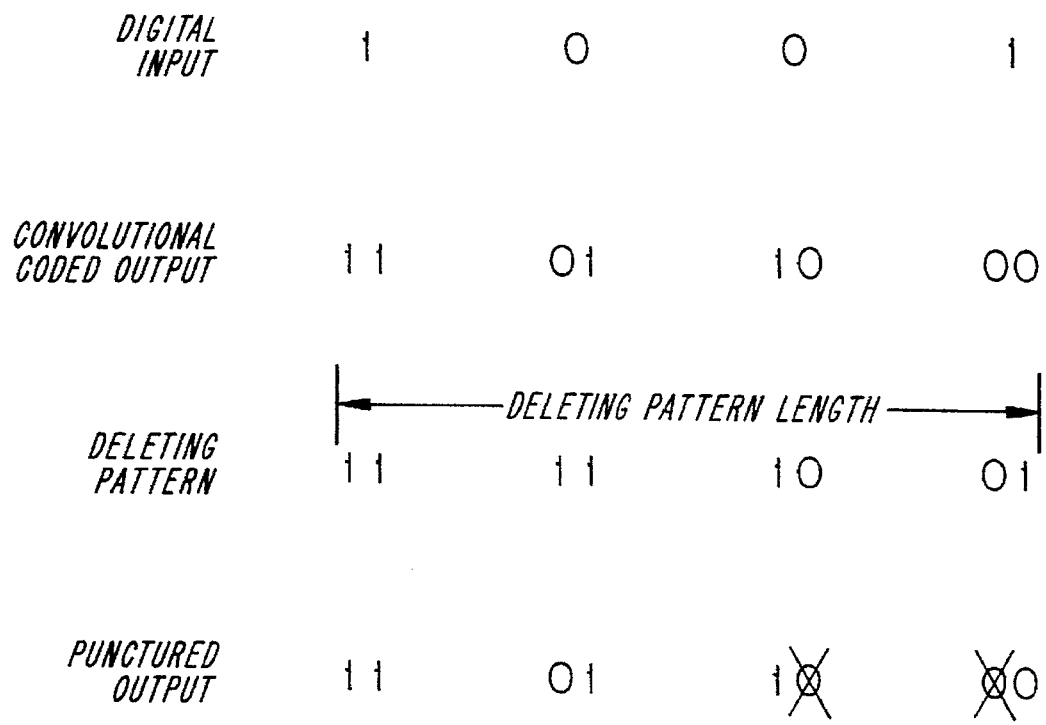
FIG. 4b shows an example bit stream passing through the coder of the present invention.

FIG. 4a schematically illustrates an example input bit stream of bits 1 0 0 1 passing through a prior art coder, while FIG. 4b schematically illustrates an identical example input bit stream passing through coder 16 of the present invention. The prior art coder and present invention coder 16 are of the type generally illustrated in FIG. 2 and include a convolutional coding circuit 20 of rate $k/n=\frac{1}{2}$ and a puncturing circuit 22 designed to generate a puncturing code of $z/q=\gamma k/q=(2)(1)/3=\frac{2}{3}$. As shown in FIGS. 4a and 4b, the input bit stream is first convolutionally coded so that for each 1-bit k-tuple, a 2-bit n-tuple is outputted. The n-tuples form the convolutionally coded output depicted as 1 1 0 1 1 0 0 0.

The prior art coder shown in FIG. 4a punctures the convolutionally coded output according to a deleting pattern having a ratio of ones to zeros of three to one and a length $L=\gamma n=2\times2=4$. The deleting pattern of the prior art coder is 1 0 1 1 and generates a punctured output for the input bits of 1 0 1 1 0 0. In contrast, the present invention coder 16 punctures the convolutionally coded output according to a deleting pattern having a ratio of ones to zeros of six to two (i.e., the ratio of ones to zeros for the deleting pattern of the present invention is mathematically equivalent to the three to one ratio of ones to zeros of the present invention) and an extended bit length of $L=p\gamma n=2\times2\times2=8$. The deleting pattern of the present invention coder is 1 1 1 1 1 0 0 1 and generates a punctured output for the input bits of 1 1 0 1 1 0. Because the length of the deleting pattern is larger than the minimum bit length used by prior art decoders, a more optimal deleting pattern can be chosen. The bit length of the deleting pattern of the present invention can be chosen to be any multiple of $\gamma n$ which is greater or equal to 2.

Figure 5:
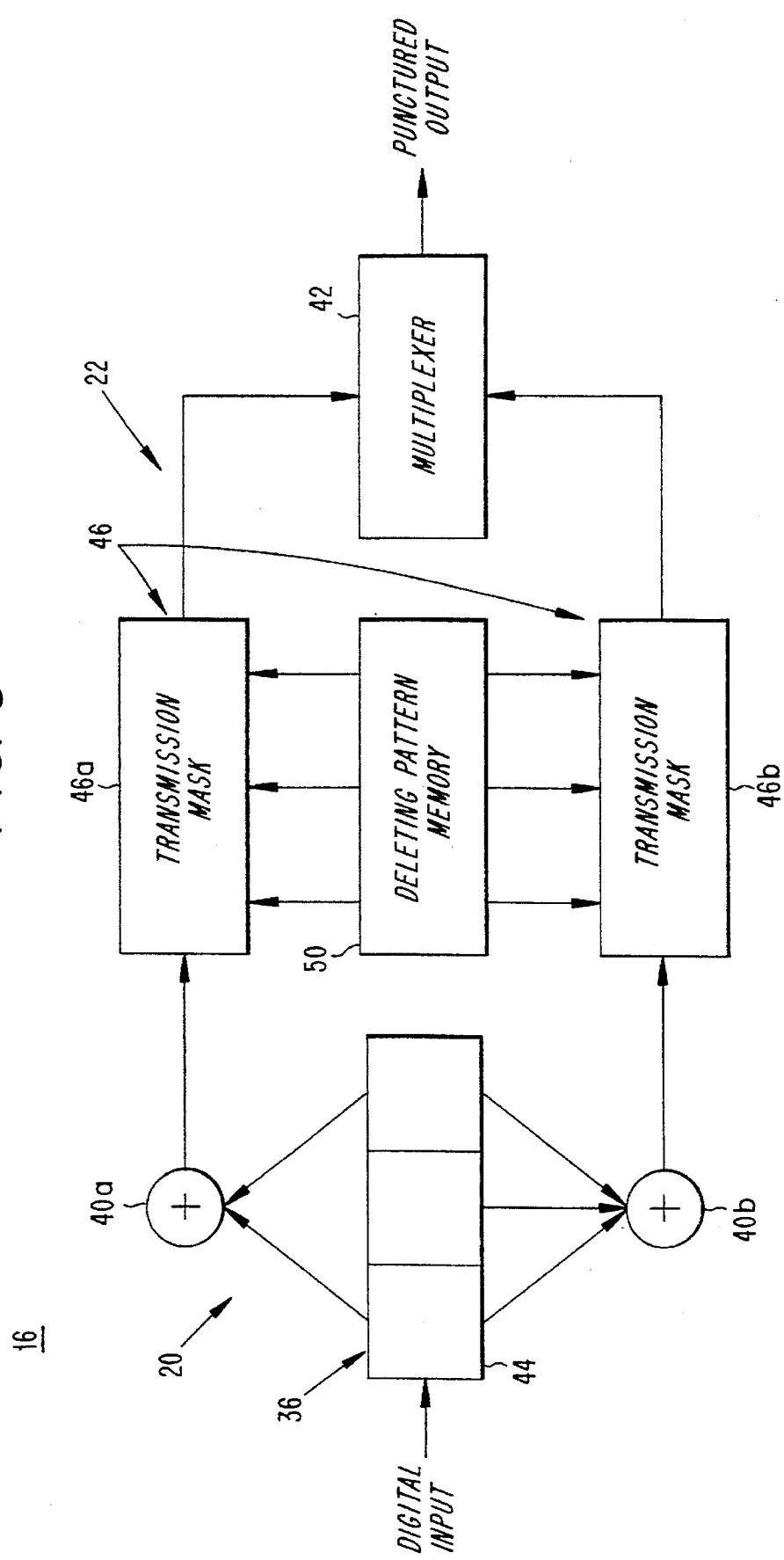
FIG. 5 is a block diagram of an alternate embodiment coder.

An example of an alternate embodiment of coder 16 is shown in FIG. 5. In this alternate embodiment, the puncturing circuit 22 includes a transmission mask circuit 46 located upstream of the multiplexer 42. The transmission mask circuit 46 includes a first transmission mask 46a connected to the first function generator 40a and a second transmission mask 46b connected to the second function generator 40b. The transmission masks 46a and 46b are arranged in parallel with respect to the function generators 40a and 40b such that each generator bit stream can be punctured by a separate transmission mask 46a or 46b. As each of the generator bit streams passes through its respective transmission mask 46a or 46b, each transmission mask 46a or 46b groups its associated generator bit stream into parallel blocks. The combined parallel blocks of the different transmission masks 46a and 46b together form a puncturing circuit block. The puncturing circuit block is punctured according to a deleting pattern stored in the deleting pattern memory 50. The length of the puncturing circuit block in corresponding deleting pattern, the ratio of ones to zeros of the deleting pattern, and the arrangement of ones and zeros in the deleting pattern are chosen in the same manner as described for the preferred embodiment. However, each transmission mask 46a and 46b punctures its respective bit stream according to only a segment of the deleting pattern.

For example, a deleting pattern of eight bits would be selected for a digital communication system 10 having a convolutional code of code rate ½ and a punctured code rate of ⅔. (See previous discussion provided in connection with FIGS. 4a and 4b). The first transmission mask 46a would puncture its respective bit stream according to the first four bits of the deleting pattern and the second transmission mask 46b would puncture its respective bit stream according to the second four bits of the deleting pattern. The punctured bit streams are then combined by the downstream multiplexer 42 which outputs the punctured output.

Figure 6:
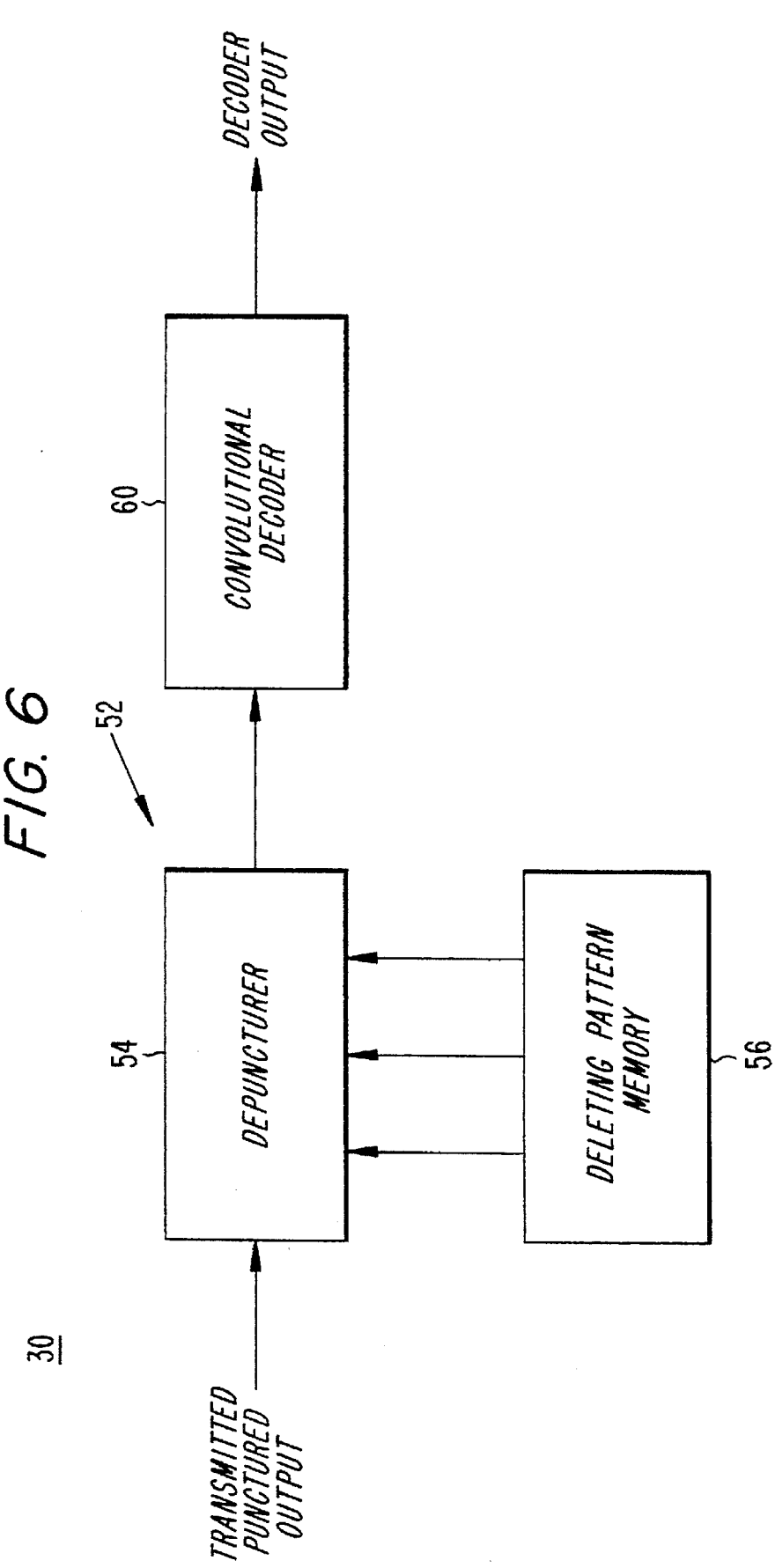
FIG. 6 is a block diagram of the decoder.

Referring to FIG. 6, the decoder 30 of receiver 14 is shown in more detail. Decoder 30 includes a depuncturing circuit 52 having a depuncturer 54 and a depuncturing pattern memory 56, and a convolutional decoder 60. The depuncturer 54 processes the received punctured output according to an inserting pattern stored in the depuncturing pattern memory 56. The inserting pattern corresponds with the deleting pattern used by the coder 16. A depunctured output is outputted by the depuncturer 54 and inputted into the convolutional decoder 60 which corresponds to the convolutional coding circuit 16. In the preferred embodiment, the convolutional decoder 60 is a maximum likelihood decoder implemented by a Viterbi decoder. The convolutional decoder 60 decodes the depunctured output and outputs a decoded output which is an estimate of the digital input of coder 16.

The present invention is directed primarily to a digital communication system 10 having an improved punctured convolutional coding system and method. More particularly, the digital communication system 10 provides for punctured codes having improved distance properties by puncturing convolutionally coded outputs according to deleting patterns having bit lengths greater than the minimum bit lengths required to puncture a particular convolutional code to achieve the desired punctured code rate. The deleting pattern of the present invention has bit lengths derived according to the equation $L=p\gamma n$, where p is $\geq 2$. Using a deleting pattern having an extended bit length provides for improved distance properties of the punctured output resulting in an improved bit error rate for digital communication system 10.

Specific details of the block elements of the digital communication system 10 described above can be located in many references previously published and a detailed discussion of such is not deemed necessary. Different embodiments and adaptations besides those shown herein and described as well as many variations, modifications and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is merely for purposes of providing a full and enabling disclosure of the invention. Accordingly, it is intended that the invention be limited only by the spirit and scope of the claims appended hereto.

What is claimed is:

1. A device for convolutionally coding a digital input to produce a convolutional coded output, and for puncturing the convolutional coded output to generate a punctured output for transmission comprising:
   a. a convolutional coding circuit of code rate k/n for receiving the digital input and defining input k-tuples of k-bits, and for outputting for each k-tuple a corresponding n-tuple of n-bits where the n-tuples form a convolutional coded output;
   b. a puncturing circuit for receiving the convolutional coded output and for puncturing the convolutional coded output on a block-by-block basis so as to output a punctured output at a punctured code rate of z/q, where $z=\gamma k$, the puncturing circuit including:
      i) a transmission mask circuit for grouping the convolutional coded output into puncturing blocks as the convolutional coded output passes through the puncturing circuit, and for puncturing each puncturing block according to a deleting pattern having transmission and nontransmission bits,
      ii) a deleting pattern memory for storing the deleting pattern, and
      iii) wherein the deleting pattern and each puncturing block has a bit length equal to $p\gamma n$, where p is an integer $\geq 2$.

2. The device of claim 1, wherein the convolutional coding circuit includes a shift register having k-bit stages for receiving k-tuples and a plurality of function generators selectively connected to the k-bit stages, the function generators each outputting a generator bit stream where the generator bit streams together form the convolutional coded output, and the device further including a multiplexer for multiplexing the generator bit streams and outputting the convolutional coded output in the form of a convolutional coded bit stream.

3. The device of claim 1 further including a modulator for receiving the punctured output and generating a modulated output corresponding to the punctured output and transmitting the modulated output to a receiver.

4. The device of claim 1 wherein said deleting pattern is selected so as to provide improved distance properties of the punctured output over potential deleting patterns of bit lengths equal to $\gamma n$.

5. The device of claim 1, wherein the convolutional coding circuit includes a shift register having k-bit stages for receiving k-tuples and a plurality of function generators selectively connected to the k-bit stages, the function generators each outputting a generator bit stream where the combined generator bit streams form the convolutional coded output, and wherein the transmission mask circuit includes a plurality of transmission masks with each transmission mask being connected to and puncturing the generator bit stream from one of the function generators to form a punctured generator bit stream, the plurality of transmission masks together puncturing according to the deleting pattern with each transmission mask puncturing its associated generator bit stream on a block-by-block basis according to a deleting pattern segment such that the combined deleting pattern segments form the deleting pattern.

6. The device of claim 5 further including a multiplexer for multiplexing the punctured generator bit streams and outputting the punctured output in the form of a punctured bit stream.

7. A digital communication system, comprising:
   a. a transmitter for convolutionally coding a digital input to produce a convolutional coded output, and for puncturing the convolutional coded output to generate a punctured output and for transmitting the punctured output using a modulated signal, including:
      i) a convolutional coding circuit of code rate k/n for receiving the digital input and defining input k-tuples of k-bits, and for outputting for each k-tuple a corresponding n-tuple of n-bits where the n-tuples form a convolutional coded output;
      ii) a puncturing circuit for receiving the convolutional coded output and for puncturing the convolutional coded output on a block-by-block basis so as to output a punctured output at a punctured code rate of z/q, where $z=\gamma k$, the puncturing circuit including:
         a) a transmission mask circuit for grouping the convolutional coded output into puncturing blocks as the convolutional coded output passes through the puncturing circuit, and for puncturing each puncturing block according to a deleting pattern having transmission and nontransmission bits,
         b) a deleting pattern memory for storing the deleting pattern, and
         c) wherein the deleting pattern and each puncturing block has a bit length equal to $p\gamma n$, where p is an integer $\geq 2$; and
   b. a receiver for receiving the modulated signal and decoding the modulated signal to output a decoded output corresponding to the digital input, the receiver including:
      i) a demodulator for receiving the modulated signal and demodulating the modulated signal so as to output a punctured coded output, and
      ii) a decoder for receiving the punctured coded output and for decoding the punctured coded output so as to output a decoded output.

8. The digital communication system of claim 7, wherein the convolutional coding circuit includes a shift register having k-bit stages for receiving k-tuples and a plurality of function generators selectively connected to the k-bit stages, the function generators each outputting a generator bit stream where the generator bit streams together form the convolutional coded output, and the transmitter further including a multiplexer for multiplexing the generator bit streams and outputting the convolutional coded output in the form of a convolutional coded bit stream.

9. The digital communication system of claim 7 further including a modulator for receiving the punctured output and generating a modulated signal corresponding to the punctured output and transmitting the modulated signal to the receiver.

10. The device of claim 7 wherein said deleting pattern is selected so as to provide improved distance properties of the punctured output over potential deleting patterns of bit lengths equal to $\gamma n$.

11. The digital communication system of claim 7, wherein the convolutional coding circuit includes a shift register having k-bit stages for receiving k-tuples and a plurality of function generators selectively connected to the k-bit stages, the function generators each outputting a generator bit stream where the combined generator bit streams form the convolutional coded output, and wherein the transmission mask circuit includes a plurality of transmission masks with each transmission mask being connected to and puncturing the generator bit stream from one of the function generators to form a punctured generator bit stream, the plurality of transmission masks together puncturing according to the deleting pattern with each transmission mask puncturing its associated generator bit stream on a block-by-block basis according to a deleting pattern segment such that the combined deleting pattern segments form the deleting pattern.

12. The digital communication system of claim 11 further including a multiplexer for multiplexing the punctured generator bit streams and outputting the punctured output in the form of a punctured bit stream.

13. A punctured convolutional coding method for a digital communication system, comprising the steps of:
   a. convolutionally coding a digital input with a convolutional coding circuit of code rate k/n to produce a convolutional coded output, the convolutionally coding step including:
      i) inputting the digital input into the convolutional coding circuit and defining input k-tuples of k-bits, and
      ii) outputting for each k-tuple a corresponding n-tuple of n-bits where the n-tuples form a convolutional coded output;
   b. puncturing the convolutional coded output with a puncturing circuit to generate a punctured output of rate z/q, where $z=\gamma k$, for transmission, the puncturing step including:
      i) inputting the convolutional coded output into a transmission mask circuit,
      ii) grouping the convolutional coded output into puncturing blocks as the convolutional coded output passes through the transmission mask circuit, and
      iii) puncturing each puncturing block according to a deleting pattern having transmission and nontransmission bits,
      iv) storing the deleting pattern in a deleting pattern memory, and v) wherein the deleting pattern and each puncturing block have a bit length equal to $p\gamma n$, where p is an integer $\geq 2$.

14. The method of claim 13, wherein the convolutional coding step further includes the steps of generating a plurality of generator bit streams where the generator bit streams together form the convolutional coded output, and multiplexing the generator bit streams and outputting the convolutional coded output in the form of a convolutional coded bit stream.

15. The method of claim 13 further including generating a modulated output corresponding to the punctured output and transmitting the modulated output to a receiver.

16. The method of claim 13 wherein said deleting pattern is selected so as to provide improved distance properties of the punctured output over potential deleting patterns of bit lengths equal to $\gamma n$.

17. The method of claim 13, where the convolutional coding circuit includes a shift register having k-bit stages for receiving k-tuples and a plurality of function generators selectively connected to the k-bit stages, and wherein the convolutional coding step further includes the steps of outputting a generator bit stream from each function generator where the generator bit streams together form the convolutional coded output; and wherein the puncturing step further includes the steps of puncturing each generator bit stream with a different transmission mask where the different transmission masks form the transmission mask circuit, and puncturing the plurality of generator bit streams according to the deleting pattern with each transmission mask puncturing its associated generator bit stream on a block-by-block basis according to a deleting pattern segment such that the combined deleting pattern segments form the deleting pattern and the transmission masks output punctured generator bit streams forming the punctured output.

18. The method of claim 17 further including the step of multiplexing the punctured generator bit streams and outputting the punctured output in the form of a punctured bit stream.

* * * * *